United States Patent [19]

Sondermeyer

[11] 4,405,832
[45] Sep. 20, 1983

[54] CIRCUIT FOR DISTORTING AN AUDIO SIGNAL

[75] Inventor: Jack C. Sondermeyer, Meridian, Miss.

[73] Assignee: Peavey Electronics Corp., Meridian, Miss.

[21] Appl. No.: 268,647

[22] Filed: May 29, 1981

[51] Int. Cl.³ .............................................. G10H 1/06
[52] U.S. Cl. .................................. 179/1 D; 179/1 M; 84/1.24
[58] Field of Search ............. 179/1 A, 1 D, 1 F, 1 M, 179/1 VL; 330/149; 333/28 T; 84/1.24, 1.25, DIG. 10

[56] References Cited

U.S. PATENT DOCUMENTS

| | | | |
|---|---|---|---|
| 3,835,409 | 9/1974 | Laub | 84/1.24 X |
| 3,973,461 | 8/1976 | Jahns | 84/1.24 |
| 4,002,994 | 1/1977 | Fender | 179/1 D X |
| 4,101,840 | 7/1978 | Fricke et al. | 179/1 VL X |
| 4,151,477 | 4/1979 | Yokoyama | 333/28 T X |
| 4,180,707 | 12/1979 | Moog | 84/1.24 X |
| 4,194,165 | 3/1980 | Skulski | 179/1 F X |
| 4,211,893 | 7/1980 | Smith | 179/1 A |

FOREIGN PATENT DOCUMENTS 53-27020  3/1978  Japan .................................... 84/1.24

OTHER PUBLICATIONS

Markus, John; *Sourcebook of Electronic Circuits;* McGraw-Hill, N.Y., 1968, p. 518.
Jung, Walter G.; *IC OP-AMP Cookbook;* Howard W. Sams & Co., Inc. Indianapolis, Ind., 1974; pp. 326–331.
*Hobby Electronics;* vol. 3, No. 5, Mar. 1981; pp. 54–56; "Guita Fuzz Box".
*Practical Electronics;* vol. 13, No. 1, p. 61, Jan. 1977; "Guitar Fuzz Unit" by J. White.
*Elektor,* Jul./Aug. 1980, pp. 7-58 to 7-59; "Sound Effects Generator".

*Primary Examiner*—G. Z. Rubinson
*Assistant Examiner*—Keith E. George
*Attorney, Agent, or Firm*—Berman, Aisenberg & Platt

[57] ABSTRACT

Circuitry is provided for distorting an audio signal, useful in providing a "dirty" sound to an electric guitar simulating a vacuum tube amplification thereof. The circuit includes components for simultaneously changing the amount of distortion introduced by a clipping circuit and the amount of gain boost provided at a preselected narrow bandwidth. Addition of such gain boost leads both to increased clipping of the audio signal and to reduced frequency response, at both low and high frequencies. A separate volume control is provided for broad band gain adjustment. Independently operable control switches permit insertion or elimination of the distortion, and insertion or elimination of a brightness circuit boosting high frequency response of the circuit.

10 Claims, 7 Drawing Figures

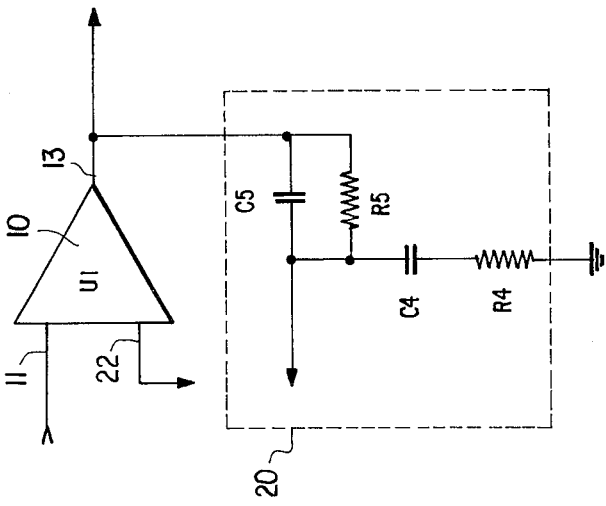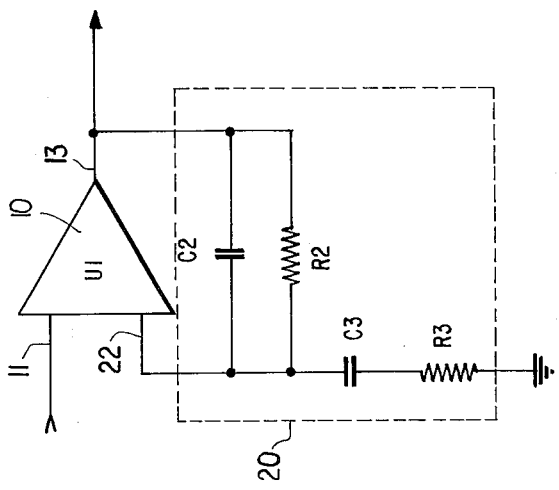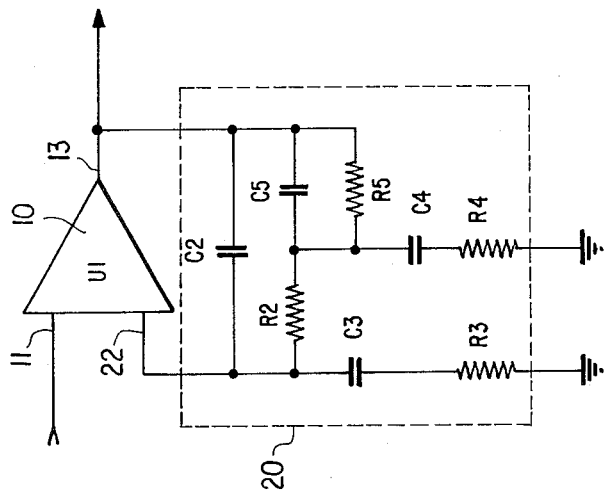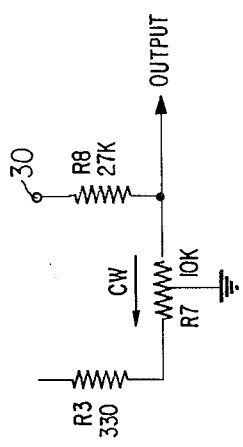

CIRCUIT FOR DISTORTING AN AUDIO SIGNAL

BACKGROUND OF THE INVENTION

1. Field of the Invention

This invention relates to preamplifiers for use with musical instruments, and more particularly to such preamplifiers having circuitry for simulating a vacuum tube amplifier including the distortion produced by such amplifiers.

2. Background Art

Musical instrument amplifiers, traditionally incorporating vacuum tube devices, have been used with various instruments for quite some time. Electric guitars, for example, which generate essentially a "clean" or undistorted sinewave, were among the first instruments to rely heavily on vacuum tube amplification. Such amplification was typically faithful to the sound generated by the guitar, which was thus faithfully reproduced on an associated speaker.

Because vacuum tubes are inherently forgiving devices, operable in almost any circuit design, various inexpensive and amateurish design techniques began to be used with the vacuum tube amplifiers. The use of poor designs, marginal components such as cheap transformers, and the like led to a proliferation of amplifiers providing distortion caused by poor gain balancing and restricted ranges of linear operation. As a result, premature clipping or overdriving of various stages within the amplifier took place. The transformers similarly provided their own distortion to the output signal, due to saturation, for example.

The distorted output of such vacuum tube amplifiers, however, became appreciated and desired, particularly for rock 'n roll music of the later 1960's.

Thus it was that the guitar became, effectively, an inexpensive synthesizer wherein the sine waves generated by the guitar were transformed into square waves by amplifier clipping. The amplifier's overload, equalization, damping factor and loudspeaker response characteristics ultimately determined the output sound. Such output sound differed from the conventional clean guitar heard in early rock'n roll, country, surfing music, and the like. Rather, a reedy quality was produced, resembling, for example, the reedy sound of a woodwind instrument such as a clarinet in response to insertion of a single sustained note into the amplifier.

In the past one to two decades, the above described output sound has become identified with a "good" electrical guitar sound, and several attempts have been made to reproduce this sound with transistorized circuits.

Moog U.S. Pat. No. 4,180,707, for example, discloses a "fuzz box" for producing four types of clipping. Only two clipping levels are provided, however, defined therein as "soft" and "hard" clipping. Further, with no attempt at changing the frequency characteristic of the amplifier, the disclosed circuit cannot truly simulate a vacuum tube amplifier.

Jahns U.S. Pat. No. 3,973,461 discloses a vacuum tube circuit for providing varying degrees of distortion, and an essentially identical solid state circuit for replacing the tube. The circuit fails to provide compensation for increased gain by variation of frequency response, and generally does not combine gain, frequency response variation and distortion.

Laub U.S. Pat. No. 3,825,409 discloses an amplifier for use with electric guitars for introducing crossover distortion proportional to the amplitude of the input signal, otherwise suffering from the same defects of the prior art.

SUMMARY AND OBJECTS OF THE INVENTION

It is accordingly an object of the present invention to overcome the deficiencies of the prior art and to provide a circuit for introducing gain, overload characteristics, and frequency response modification into a musical instrument amplifier.

It is a further object of the invention to provide a single control for substantially simultaneous variation of gain and clipping characteristics of a distortion circuit.

It is yet another object of the invention to provide a single control for substantially simultaneous variation of gain and frequency response of a distortion circuit.

Still another object of the invention is the provision of a circuit for distorting an applied audio signal to a preselected degree, and including a separate control for removing or inserting the preselected degree of distortion.

The present invention accordingly provides a distortion generating circuit, including a high gain operational amplifier having a variable, controlled feedback network for varying the gain and frequency response thereof. Additionally, a specific distortion circuit, comprising a pair of oppositely poled, anti-parallel diodes, is provided for clipping the output signal of the amplifier. A first control is provided in the feedback network for controlling gain and frequency response of the amplifier. A second control is provided for mixing the output of the amplifier with that of the clipping circuit in variable proportions. The two controls are preferably ganged, to provide appropriate tracking between the amount of gain and clipping, as well as frequency response modification.

BRIEF DESCRIPTION OF THE DRAWINGS

The foregoing and other objects, features and advantages of the invention will become more readily apparent upon reference to the following detailed description of the preferred embodiment, when taken in conjunction with the accompanying drawing in which like numbers refer to like parts.

FIGS. 2-5 are schematic representations of various portions of the circuit in FIG. 1;

FIG. 6 shows a volume control circuit for use with the circuit of FIG. 1; and

FIG. 7 shows a brightness circuit for use with the circuit of FIG. 1.

DETAILED DESCRIPTION OF THE PREFERRED EMBODIMENT

Figure 1:
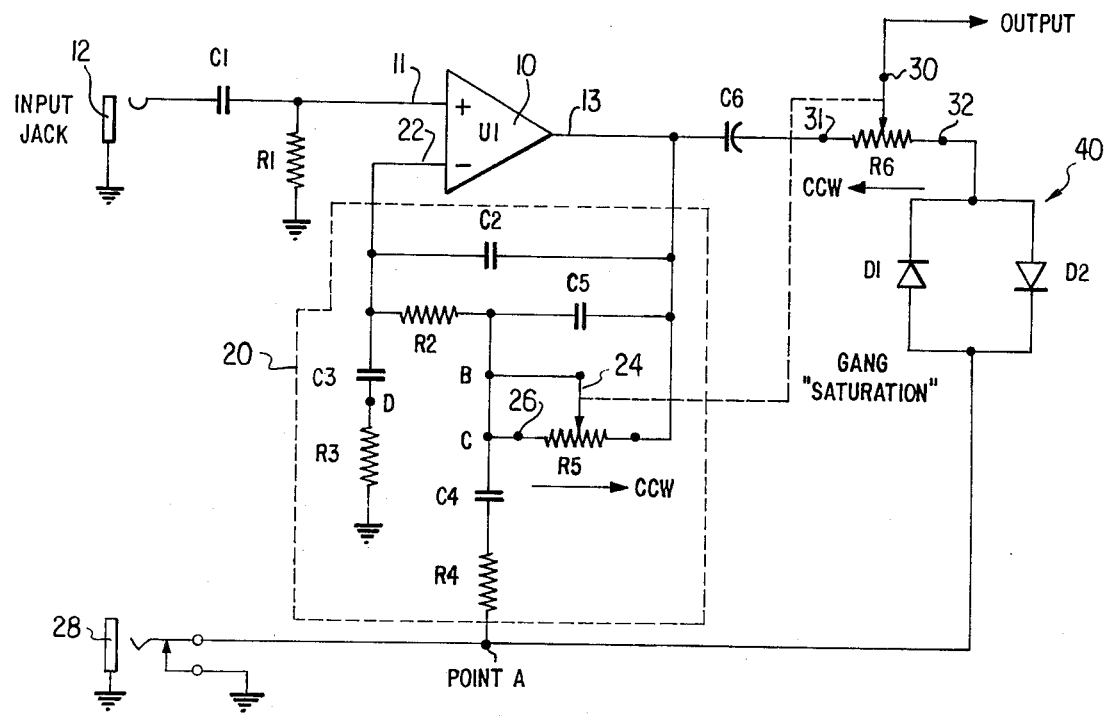
FIG. 1 shows the inventive circuit.

Referring now to the drawings, the circuit according to the invention is shown in FIG. 1. Therein it is seen that a high gain operational amplifier 10 receives at its non inverting input terminal 11 an audio input signal from input jack 12. The audio signal is typically generated by an electric guitar, although the circuit may, of course, be used with other sources of input signals. The input signal is coupled from jack 12 to terminal 11 by a conventional RC circuit, comprising a capacitor C1 and a resistor R1. Capacitor C1 is connected at one terminal to jack 12, and at its other terminal to input terminal 11. Resistor R1 is connected between the junction of capacitor C1 and terminal 11, on the one hand, and ground on the other, to provide a D.C. ground reference for the input terminal 11.

The output of amplifier 10 is provided at an output terminal 13. A feedback network 20 couples the output of operational amplifier 10 from its output terminal 13 to an inverting input terminal 22.

Feedback network 20 includes a capacitor C2 connected directly between output terminal 13 and input terminal 22. A series circuit, including a resistor R2 in series with a parallel combination of a potentiometer R5 and a capacitor C5, is connected across capacitor C2. The potentiometer R5 is connected as a straightforward variable resistance across capacitor C5, having its wiper 24 shorted to one of its terminal 26 in such a manner that complete counterclockwise rotation of the wiper will fully short circuit capacitor C5. The junction between capacitor C5 and resistor R2 is connected through points B and C to a further capacitor C4 in series with a resistor R4, connected to a point A. As shown in the Figure, points B and C are connected to the wiper 24 and terminal 26 of the potentiometer R5, respectively.

Inverting input terminal 22 is connected to a series circuit comprising a capacitor C3 and a resistor R3, which is, in turn, grounded. C3 and R3 provide a predetermined low-frequency roll off for the frequency response characteristic of the operational amplifier, while capacitor C2 is used to determine high-frequency roll-off, as described below. The junction between capacitor C3 and resistor R3 is labelled D, and will be referenced in connection with FIG. 7.

Point A of the feedback network, at the terminal of R4, may be grounded or may float, depending on the condition of a footswitch 28.

The output of amplifier 10 is coupled through capacitor C6 to a mixing potentiometer R6, connected to provide the circuit output at its wiper 30. Terminals 31 and 32 of the potentiometer R6 are connected so that full counterclockwise rotation of the wiper connects wiper 30 to coupling capacitor C6.

A distortion generating circuit, for clipping the signal outut from amplifier 10, is generally shown at 40. The present circuit generates clipping distortion by use of anti-parallel diodes D1 and D2. One terminal of circuit 40 is connected to terminal 32 of potentiometer R6, and the other is connected to point A.

In view of the previously described arrangement for potentiometer R6, it is seen that when wiper 30 is rotated fully clockwise, it is connected directly to the distortion generating circuit 40.

Figure 2:
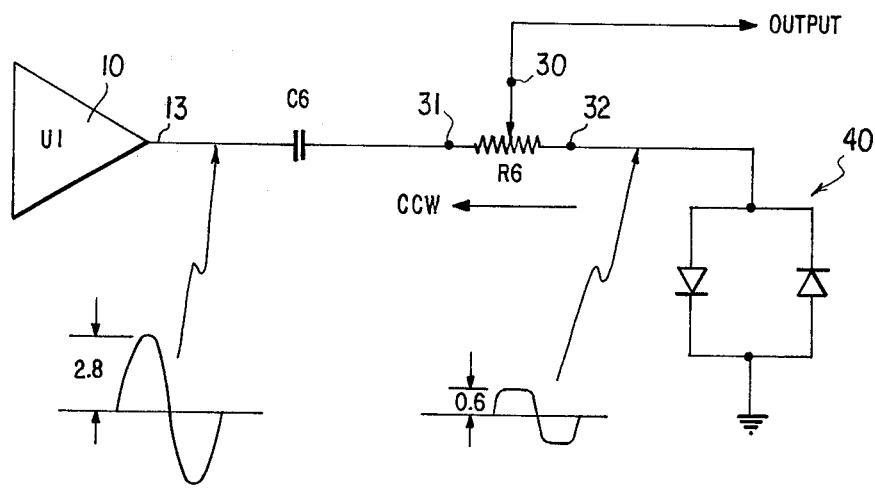

General operation of the circuit may be appreciated with reference to FIG. 2, showing a portion of FIG. 1 for ease of comprehension.

As is known in the art, silicon diodes typically provide a forward voltage drop of 0.6 volt when in the conducting mode. Accordingly, when amplifier 10 provides an output voltage which is sinusoidal, such as shown illustratively in FIG. 2, that output sinusoid will be clipped by distortion circuit 40. That is, the signal at terminal 32 of potentiometer R6 will not exceed a 1.2 volt peak to peak excursion.

Thus, where signals having greater excursions are output by amplifier 10, clipping will take place. The greater the amplitude of the output of amplifier 10, the greater will be the degree of clipping of the waveform by circuit 40. For example, where a 2 V RMS (5.6 V peak-to-peak) sinusoid is output by amplifier 10, a 1.2 volt clipped sinusoid, shown in FIG. 2, will be observed at terminal 32 of R6. It is thus seen that by adjusting the location of wiper 30, the user can obtain at the circuit output (wiper 30) a mix of any ratio of the sinusoid output by amplifier 10 and the clipped waveform output by circuit 40. The ratio may, of course, include only the pure sinusoid or only the clipped waveform, as desired.

Referring once again to FIG. 1, specifically with emphasis on feedback network 20, it is seen that potentiometer R5 can substantially alter the effect of that network.

As is apparent from FIG. 1, when R5 is in its full counterclockwise setting, capacitor C5 is shorted out, and capacitor C4 and resistor R4 are no longer connected in a feedback path, but rather are directly connected from output terminal 13 of amplifier 10 to point A.

The resulting circuit is shown in FIG. 4, and is recognized as being a standard broadband amplifier with feedback resistor R2 and shunt resistor R3. The gain of this circuit is known to be given by the equation.

$$A_v = 1 + \frac{R2}{R3},$$

providing a typical gain $A_v = 8$ for values of R2=33 Kohm, and R3=4.7 Kohm.

The frequency response of the amplifier is provided by capacitors C2 and C3, with capacitor C2 providing high-frequency roll off at a frequency determined by $$f_h = \frac{1}{6.28 \, (R2 \, C2)}.$$

Capacitor C3 provides low frequency roll-off at a 3 db frequency given by $$f_1 = \frac{1}{6.28 \, (R3 \, C3)}.$$

For typical capacitive values contemplated for use in the present circuit, C2=100 pF and C3=2 uF, it is seen that $f_1$ is approximately 16 Hz and $f_h$ is approximately 50 KHz, typical frequency response for sound amplification.

Placing potentiometer R5 in the full clockwise position results in introduction of the full resistance value R5 into the circuit, shown in FIG. 3 for the case of point A being grounded. That circuit may be roughly considered as equivalent to a combination of the two circuits shown in FIGS. 4 and 5. Thus, a further series feedback resistor R5, and a further shunt resistor R4, are added to the circuit of FIG. 4, resulting in a change in the gain of the amplifier 10.

As one rough estimate of the change in gain, the following equation, applying the typical gain equation to the circuit of FIG. 5, shows $$A_v = 1 + \frac{R5}{R4} = 22 \text{ for } R5 = 10K, R4 = 470.$$

In addition to introducing gain for the circuit of amplifier 10, however, rotation of potentiometer R5 to its full clockwise position also introduces reactive impedances C4 and C5 into the circuit, which affect both the low end and the high end of the frequency response characteristic of the amplifier.

For example, with a capacitor C4=0.47 uF, the R4 C4 combination provides the added gain at a lower 3 db frequency of approximately 700 Hz. Similarly, with C5=0.0068 uF, an upper 3 db frequency is provided by the R5 C5 combination approximately at 2 KHz.

It is thus seen that the added gain is within a narrow bandwidth, providing a combined frequency characteristic having a so-called "bell-shaped curve" centered at approximately 1.3 KHz for the present example. Moreover, the added capacitances interact with the capacitances of FIG. 4 to provide a lowered upper 3 db frequency and a raised lower 3 db frequency for the entire circuit.

This feature of the present invention is highly desirable in order to simulate the "vacuum-tube" distortion of guitar amplifiers.

With saturation of the tube amplifier output transformers, low frequency response is reduced. Accordingly, by inserting R4 and C4 in the feedback circuit, such a reduction in the lower end of the frequency response of the circuit as previously described simulates the desired effect. Moreover, since most guitar amplifiers presently available have a high-frequency preemphasis built in, it is necessary to eliminate that preemphasis proportionally with increased gain.

The present circuit, by providing C5 in combination with R with increasing gain, achieves precisely this desired result.

As is also seen in FIG. 1, potentiometers R5 and R6 are ganged, so that at full counterclockwise rotation no gain is added and no change in frequency is provided by R5, and no distortion is provided to the output signal by R6. Increasing clockwise rotation provides for increased gain by insertion of R5, changes in the frequency response as previously described, and an increase in the ratio of clipped to pure waveforms provided to the output, exactly as desired.

As previously mentioned, point A is controllably connected to ground by footswitch 28. As is apparent from FIG. 1, when point A is left floating, neither the diode clipping circuit nor the resistive added gain circuit of R5-R4 is connected to ground, so that neither clipping nor added gain will be provided. That is, by ungrounding point A, the tube-simulation circuitry is defeated, and the circuit is operated in its normal, wide bandwidth low gain condition. A slight increase in gain is retained by action of resistor R5 in conjunction with R2 on resistor R3. However, with R5 and R4 chosen substantially lower than R2 and R3, respectively, such an increase is negligible.

When footswitch 28 grounds point A, however, operation will be as previously described, including gain adjustment, frequency response modification, and distortion addition. Having preset the potentiometer R5 to some desired value, it is seen that the setting need not be destroyed to remove the distortion. Rather, simple activation or deactivation of the footswitch 28, possibly from a remote location, is sufficient to defeat the effect or to provide the distortion at precisely the desired levels.

Referring now to FIGS. 6 and 7, additional circuits are shown for inclusion with the circuit of FIG. 1 to provide additional effects.

A broad bandwidth volume control for the entire circuit is shown in FIG. 6, and is obtained by taking the output across a portion of a potentiometer R7 instead of directly from wiper 30 of potentiometer R6. To provide the volume control, resistor R3 is connected to one terminal of R7, rather than to ground, and an added resistor R8 is provided between wiper 30 of R6 and the other terminal of R7. The system output is taken at the junction between resistors R8 and R7. As will be appreciated, when the wiper of R7, which is grounded, is fully in the clockwise position (grounding R3), full output is obtained from wiper 30 by a voltage divider circuit comprising R7 and R8. However, when the wiper of R8 grounds the output terminal of FIG. 6, in the full counterclockwise position, no output is obtained. Varying output levels are obtained for varying settings of potentiometer R7.

FIG. 7 shows a brightness circuit for optional use with the present circuit. This circuit provides optional high frequency boost effects to change the overall tone structure of the instrument sound amplified by the inventive circuit.

Other variations not shown, useful for altering the overall frequency response and potentiometer action of the present circuit, include the possible addition of a 1.5 K-ohm resistor between points B and C of FIG. 1, and a shunting 2.7 K-ohm resistor between point C and ground.

Typical values of components used in the circuit of FIG. 1 are shown in the following table.

| COMPONENT | VALUE |
|---|---|
| R1 | 220 K |
| R2 | 33 K |
| R3* | 330 |
| R4 | 470 |
| R5 | 10 K |
| R6 | 1 K |
| R7 | 10 K |
| R8 | 27 K |
| C2 | 100 pF |
| C3 | 2 $\mu$F |
| C4 | 0.47 $\mu$F |
| C5 | 0.0068 $\mu$F |
| C6 | 2.2 $\mu$F |

*For example, instead of single diodes D1 and D2, two diodes in series can be inserted in each leg of the anti-parallel configuration. This doubles the effective signal output of the distortion generating circuit.

The preceeding specification describes the preferred embodiment of the invention as an illustration and not a limitation thereof. It is appreciated that equivalent variations and modifications of the invention will occur to those skilled in the art. Such modifications, variations and equivalents are within the scope of the invention as recited with greater particularity in the appended claims, when interpreted to obtain the benefits of all equivalents to which the invention is fairly and legally entitled.

What is claimed is:

1. A circuit for distorting an input signal comprising
   (a) amplifier means for receiving said input signal and producing an output signal,
   (b) distortion means having one terminal connected to said output signal for distorting said output signal, and another terminal connected to a switch for selectively connecting said another terminal to a ground voltage or to voltage which substantially equals said output signal,
   (c) whereby said distortion means distorts said output signal when said another terminal is connected to ground and does not distort said output signal when said another terminal is connected to said voltage which substantially equals said output signal.

2. The circuit of claim 1 wherein said distortion means comprises at least one diode.

3. A circuit for providing a distorted signal comprising
(a) amplifier means for receiving an undistorted input signal and for providing an output signal,
(b) first means for providing broad-band gain of said amplifier,
(c) second means for selectively controlling the gain of said amplifier, comprising means for providing a larger gain for selected frequencies in said broad band and a lesser gain for other frequencies,
(d) distortion means connected to said output signal for providing a selective amount of distortion to said output signal, and
(e) control means for simultaneously controlling said second means and said distortion means to increase said gain for said selected frequencies and to increase said distortion.

4. The circuit of claim 3 wherein said control means includes first and second variable resistors ganged together for simultaneous operation.

5. The circuit of claim 4 wherein said selected frequencies are in the center of said broad band so that said second means provides a bell-shaped gain function.

6. The circuit of claim 5 wherein said second means comprises a parallel combination of said first variable resistor and a first capacitor, and a series combination of a second capacitor and a second resistor.

7. The circuit of claim 6 wherein one end terminal of said series combination is connected to said parallel combination, and the other end terminal is connected to a switch which allows said other terminal to be connected to ground or to have a floating voltage, whereby said increased gain may be quickly eliminated by activating said switch to allow said voltage to float.

8. The circuit of claim 7 wherein one terminal of said distortion means is connected to said output signal and a second terminal is connected to said switch whereby said second terminal may be selectively connected to a ground voltage or a floating voltage substantially equal to the output voltage of said amplifier.

9. The circuit of claim 8 wherein said distortion means comprises a parallel combination of at least two inversely-poled diodes, and said one terminal is connected to said second variable resistor.

10. A circuit for distorting an audio signal as recited in claim 9 further comprising volume control means for wide bandwidth gain adjustment of said circuit for distorting, thereby permitting adjustment of the overall gain of the system.

* * * * *

Disclaimer 4,405,832.—*Jack C. Sondermeyer*, Meridian, Miss. CIRCUIT FOR DISTORTING AN AUDIO SIGNAL. Patent dated Sept. 20, 1983. Disclaimer filed Jan. 10, 1986, by the assignee, *Peavey Electronics Corp.*

Hereby enters this disclaimer to claims 1 and 2 of said patent.
[*Official Gazette March 11, 1986.*]